(12) United States Patent
Zuck

(10) Patent No.: US 7,624,742 B1
(45) Date of Patent: Dec. 1, 2009

(54) METHOD FOR REMOVING ALUMINUM FLUORIDE CONTAMINATION FROM ALUMINUM-CONTAINING SURFACES OF SEMICONDUCTOR PROCESS EQUIPMENT

(75) Inventor: David S. Zuck, Coppell, TX (US)

(73) Assignee: Quantum Global Technologies, LLC., Dublin, PA (US)

( * ) Notice: Subject to any disclaimer, the term of this patent is extended or adjusted under 35 U.S.C. 154(b) by 564 days.

(21) Appl. No.: 11/360,238

(22) Filed: Feb. 22, 2006

Related U.S. Application Data

(63) Continuation-in-part of application No. 10/818,663, filed on Apr. 5, 2004, now abandoned.

(60) Provisional application No. 60/655,633, filed on Feb. 22, 2005.

(51) Int. Cl.
*B08B 6/00* (2006.01)
*C25F 1/00* (2006.01)
*C25C 3/30* (2006.01)
*C25C 5/00* (2006.01)

(52) U.S. Cl. .................... 134/1.3; 438/745; 438/754

(58) Field of Classification Search ................ None
See application file for complete search history.

(56) References Cited

U.S. PATENT DOCUMENTS

| 3,262,825 | A |   | 7/1966  | Fuller         |         |
|-----------|---|---|---------|----------------|---------|
| 4,087,367 | A | * | 5/1978  | Rioult et al.  | 252/79.1|
| 4,345,969 | A |   | 8/1982  | James et al.   |         |
| 5,052,421 | A | * | 10/1991 | McMillen       | 134/2   |
| 5,614,028 | A |   | 3/1997  | Rodzewich      |         |
| 6,306,226 | B1| * | 10/2001 | Iino et al.    | 148/247 |
| 6,607,605 | B2|   | 8/2003  | Tan            |         |
| 6,810,887 | B2| * | 11/2004 | Tan            | 134/1.3 |
| 2005/0037193 | A1 | | 2/2005 | Sun et al.     |         |
| 2005/0045209 | A1 | | 3/2005 | Tan            |         |

FOREIGN PATENT DOCUMENTS

GB 1195944 6/1970
JP 1-243528 9/1989

OTHER PUBLICATIONS

U.S. Appl. No. 10/818,663, filed Apr. 2004, Dwight J. Zuck.
Walker, Perrin, et al., "CRC Handbook of Metal Etchants." CRC Press LLC, Boca Roban, Fl. 1991. pp. 1251-1260.
"Endura PVD Process Kit Catalog," revision C, Applied Materials, Inc. Oct. 1993. 40 pages.

* cited by examiner

*Primary Examiner*—Duy-Vu N Deo
(74) *Attorney, Agent, or Firm*—Silicon Edge Law Group LLP; Arthur J. Behiel

(57) ABSTRACT

Described are methods of removing aluminum fluoride contaminants from aluminum, anodized aluminum, and sprayed ceramic surfaces. Hydrofluoric acid, long known to be effective at removing certain contaminants, has not been used to dissolve aluminum fluoride on aluminum-containing surfaces because the hydrofluoric acid strongly attacks such surfaces, and consequently damages sensitive components. Methods used in accordance with some embodiments remove aluminum fluoride using a mixture of hydrofluoric acid and one or more anhydrous acid. Suitable anhydrous acids include acetic acid.

9 Claims, No Drawings

METHOD FOR REMOVING ALUMINUM FLUORIDE CONTAMINATION FROM ALUMINUM-CONTAINING SURFACES OF SEMICONDUCTOR PROCESS EQUIPMENT

CROSS REFERENCE TO RELATED APPLICATIONS

This application is a continuation-in-part of U.S. patent application Ser. No. 10/818,663, filed Apr. 5, 2004, now abandoned, entitled "Etchant for Removing Silicon Oxides from Aluminum, Yttrium Oxide and Ceramic," which is incorporated by reference herein as though fully set forth herein. The present application also claims the benefit under 35 U.S.C. § 119 of Provisional Application Ser. No. 60/655,633, filed Feb. 22, 2005, which is incorporated by reference herein as though fully set forth herein.

BACKGROUND

Semiconductor devices are built up using a number of material layers. Each layer is patterned to add or remove selected portions to form circuit features that will eventually make up an integrated circuit. Some layers can be grown from another layer; for example, an insulating layer of silicon dioxide can be grown over a layer of silicon by oxidizing the silicon surface. Other layers are formed using deposition techniques, typical ones being chemical vapor deposition (CVD), evaporation, and sputtering.

Deposition methods form layers using vaporized materials that condense to form a film on the surface of interest. Unfortunately, the films thus formed are not limited to the surface of interest, but tend also to form on other surfaces within the reaction chamber. Thus, after substantial use, a thick film of the deposited material accumulates on components and surfaces within the reaction chamber. These films eventually become troublesome sources of contaminants.

Etch processes also contaminate inside surfaces of reaction chambers. Etching involves applying a non-erodible photoresist mask to a surface such as a silicon or silicon dioxide layer, so that the areas of the layer not covered by the mask can be removed by exposure to an etching medium. However, the chemical reaction between the etchant and the underlying layer, or between the etchant and the surface of the reaction chamber and component parts, often produces byproducts that contaminate the surface of the chamber and internal components.

Semiconductor process equipment includes a reaction chamber with internal surfaces exposed to the process occurring within the chamber, and components within the chamber that are also exposed to the reaction process. In both deposition and etching processes, semiconductor process equipment with contaminated surfaces must be periodically cleaned or replaced.

Unfortunately, some forms of contamination are so stubbornly attached to the underlying material that removal of the contamination jeopardizes the part to be cleaned. There is a need for cleaning methods that minimize the damage to the chamber or component surface beneath the contamination.

For example, in a plasma etching process, the etchant is often a fluorine-containing gas. In the plasma, the gas breaks down, producing free fluorine radicals that attack the silicon. Examples of fluorine-containing gases used as etchants include halocarbon 14 ($CF_4$), halocarbon 32 ($CH_2F_2$), halocarbon 116 ($C_2F_6$), chlorine trifluoride ($ClF_3$), sulfur hexafluoride ($SF_6$) and nitrogen trifluoride ($NF_3$). The advantage of nitrogen trifluoride is that when it breaks down in the plasma, the only other element is nitrogen, an inert gas. With the halocarbons, there are free carbon molecules in the plasma; with chlorine trifluoride and sulfur hexafluoride, the other elements are chlorine and sulfur, respectively, which are both aggressive and potentially destructive elements. Thus, the industry is gravitating to nitrogen trifluoride.

Initially, chamber surfaces and components were typically made of aluminum, often with an anodized aluminum surface. However, the fluorine radicals produced in the etching process would attack the aluminum in the exposed surfaces of the chamber and internal components and these surfaces would accumulate a layer of aluminum fluoride contamination. This is because aluminum is easily oxidized and fluorine is an even more aggressive oxidizer than oxygen. The aluminum fluoride contamination limits the life of anodized aluminum parts. The contamination caused the surfaces to become rougher and the walls of the chamber and parts to become thinner as the conversion of aluminum to aluminum fluoride ate away at the underlying material. In addition, the reaction added another contaminant to the etch process—aluminum. A solution was needed to the problem of contamination of parts made of aluminum.

Companies that make the equipment used in the etching process, such as Tokyo Electron, Limited, or TEL, and Lam Research, Inc., graduated to using parts with a surface layer of sprayed-on ceramic for the surfaces exposed to the plasma etching process. Although ceramic is typically a form of aluminum oxide, or $Al_2O_3$, as is anodized aluminum, the sprayed-on ceramic surface was found to be much more durable than anodized aluminum, and seemed to be a good solution to the problem of contamination and deterioration of anodized aluminum. For a discussion of sprayed-on ceramics, see, e.g., U.S. Pat. No. 5,209,645, which is incorporated herein by reference.

However, the fluorine from the etchant in the plasma still had an affinity to bond with the aluminum in the ceramic. Chamber surfaces and parts coated with sprayed-on ceramic built up black aluminum fluoride contaminants that were extremely difficult to remove chemically. The presence of aluminum fluoride shortened the run life of the parts, and in addition the black aluminum fluoride would begin to particulate, adding a further contaminant to the etch process. A solution was needed to the problem of aluminum fluoride on aluminum-containing parts.

The semiconductor industry then began using process-exposed parts with a surface of sprayed-on yttrium oxide. Yttrium oxide lacks aluminum, and fluorine has little or no affinity for yttrium. Thus, sprayed-on yttrium oxide appeared to be a good solution to the problem of aluminum fluoride contamination. However, yttrium oxide is expensive. By way of rough comparison, sprayed-on ceramic parts cost approximately twice as much as parts with an anodized aluminum surface, and parts with a sprayed-on yttrium oxide surface cost approximately three times as much as anodized aluminum parts. Moreover, there are still lots of old parts with anodized aluminum or ceramic surfaces that are coated with aluminum fluoride. A need still exists for a reasonably cost-effective method of cleaning aluminum fluoride off of aluminum-containing substrates without significantly degrading the underlying material.

SUMMARY

The present invention is directed to methods for cleaning various aluminum-containing components of semiconductor process equipment contaminated with aluminum fluoride.

The embodiments described herein remove this contaminant with minimal damage to the article being cleaned.

A method in accordance with one embodiment employs hydrofluoric acid to remove aluminum fluoride from aluminum-containing substrates such as aluminum, anodized aluminum and sprayed-on ceramic. Aluminum fluoride is relatively inert and thus is difficult to remove. Hydrofluoric acid chemistries are known to be effective at dissolving aluminum-containing contaminants such as aluminum fluoride but are traditionally disfavored for such tasks because they tend to aggressively attack the underlying aluminum substrate.

Methods used in accordance with some embodiments remove aluminum fluoride contamination from aluminum-containing surfaces using a mixture of hydrofluoric acid and anhydrous acetic acid. The hydrofluoric-acid used in one embodiment is 51% water and 49% hydrofluoric acid, so the cleaning mixture consists primarily of water, hydrofluoric acid, and anhydrous acetic acid.

This summary does not limit the invention, which is instead defined by the claims.

DETAILED DESCRIPTION

As noted above, many expensive semiconductor-processing components are aluminum with surfaces of aluminum, anodized aluminum or sprayed-on ceramic, and are contaminated with aluminum fluoride. Eventually, this contamination will interfere with the reaction process, either by impeding gas flow or flaking off and adding a contaminant to the process, and will also eat away at and eventually cause damage to the underlying component material.

Aluminum fluoride is relatively inert, and consequently resists most cleaning substances. Hydrofluoric acid has long been known to be effective at dissolving aluminum fluoride. Unfortunately, hydrofluoric acid also strongly attacks the aluminum in the underlying aluminum, anodized aluminum, or sprayed ceramic surface. Hydrofluoric acid thus damages surfaces made from these materials.

Some components can be cleaned using mechanical methods that scrape or blast away exterior contamination, but such methods do not work well for hard-to-reach surfaces and may also damage the surface of components or remove sensitive coatings such as sprayed ceramic. Mechanical or physical methods of removing contaminants from aluminum parts have not proven to be a robust and repeatable solution.

It is not new to clean bulk ceramic with hydrofluoric acid, but it is important to distinguish between bulk ceramic and sprayed ceramic on aluminum parts, as hydrofluoric acid mixtures may attack the aluminum in or under the sprayed ceramic.

Methods used in accordance with some embodiments remove aluminum fluoride contamination from aluminum-containing surfaces by exposing the surfaces to a hydrofluoric-acid solution prepared by combining hydrofluoric acid with an anhydrous acid. The hydrofluoric acid used in one embodiment is 51% water and 49% hydrofluoric acid, so the mixture consists primarily of water, hydrofluoric acid, and an anhydrous acid. The acid solution can be applied by e.g. spray nozzle or immersion.

A possible explanation for the effectiveness of this solution at removing aluminum fluoride from aluminum-containing substrates without damaging the substrates is that the high concentration of anhydrous acid deprives the mixture of sufficient free water to attack the aluminum. Whatever the mechanism, this chemistry has been found to remove aluminum fluoride from aluminum, anodized aluminum, and sprayed ceramic surfaces without significantly damaging the underlying material.

In one embodiment, the hydrofluoric acid solution for removing aluminum fluoride from an aluminum-containing surface contains between 0.5% and 30% hydrofluoric acid and between 50% and 99% anhydrous acetic acid. If the only water added to the chemistry is provided with the commercially available hydrofluoric acid, then the mixture will typically contain less than about 25% water. A hydrofluoric acid solution is saturated with anhydrous citric acid in another embodiment.

While the present invention has been described in connection with specific embodiments, variations of these embodiments will be obvious to those of ordinary skill in the art. Therefore, the spirit and scope of the appended claims should not be limited to the foregoing description.

What is claimed is:

1. A method for removing aluminum fluoride contamination from semiconductor process equipment, the semiconductor process equipment having an oxide of aluminum underlying the aluminum fluoride contamination, the method comprising applying a hydrofluoric-acid solution to the aluminum fluoride contamination, the hydrofluoric-acid solution including hydrofluoric acid and less than 25% water.

2. The method of claim 1, further comprising preparing the hydrofluoric-acid solution by combining hydrofluoric acid and an anhydrous acid.

3. The method of claim 1, further comprising combining hydrofluoric acid and citric acid to create the hydrofluoric-acid solution.

4. The method of claim 3, further comprising saturating the hydrofluoric-acid solution with the citric acid.

5. The method of claim 1, wherein the aluminum fluoride contamination comprises a byproduct of a plasma etching process.

6. The method of claim 1, wherein the aluminum fluoride contamination comprises a byproduct of a plasma etching process that employs a fluorine-containing gas.

7. The method of claim 6, wherein the fluorine-containing gas comprises nitrogen trifluoride.

8. The method of claim 1, wherein the equipment comprises an aluminum alloy.

9. A method for removing aluminum fluoride contamination from semiconductor process equipment, the semiconductor process equipment having an exposed surface including at least one of aluminum, anodized aluminum, or a sprayed ceramic, the aluminum fluoride contamination being a byproduct of a plasma etch process that employs nitrogen trifluoride, the method comprising applying a hydrofluoric-acid solution to the exposed surface, the hydrofluoric-acid solution including between about 0.5% and 30% hydrofluoric acid, between about 50% and 99% acetic acid, and less than about 25% water.

* * * * *